(12) United States Patent
Suh

(10) Patent No.: US 7,196,954 B2
(45) Date of Patent: Mar. 27, 2007

(54) SENSING CURRENT RECYCLING METHOD DURING SELF-REFRESH

(75) Inventor: Jungwon Suh, Apex, NC (US)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 11/144,791

(22) Filed: Jun. 6, 2005

(65) Prior Publication Data

US 2006/0274589 A1    Dec. 7, 2006

(51) Int. Cl.
*G11C 7/00* (2006.01)
(52) U.S. Cl. ............... 365/207; 365/203; 365/222
(58) Field of Classification Search ............ 365/207, 365/203, 222, 149
See application file for complete search history.

(56) References Cited

U.S. PATENT DOCUMENTS 5,625,588 A * 4/1997 Seyyedy et al. ......... 365/149
6,292,417 B1 * 9/2001 Seyyedy .................. 365/203
6,717,875 B2   4/2004 Park
6,829,189 B2 * 12/2004 Lim et al. ................ 365/205
6,871,155 B2 * 3/2005 Huang ..................... 702/117
2005/0052909 A1   3/2005 Mochida

* cited by examiner

*Primary Examiner*—Anh Phung
(74) *Attorney, Agent, or Firm*—Edell, Shapiro & Finnan, LLC

(57) ABSTRACT

A bit line sensing scheme is provided for a semiconductor memory device that significantly reduces current drain during a self-refresh mode. After bit line sensing of a selected wordline and deactivation of the selected wordline, a capacitor is connected to a source node associated with a bit line sensing amplifier for the selected wordline to charge the capacitor with charge remaining on the bit line. Then, during the next activate-precharge cycle for another selected wordline, the capacitor is coupled to the source node of a bit line sensing amplifier associated with another selected wordline to discharge charge stored by the capacitor to the bit line associated with said other selected wordline. Thus, charge is returned from the bit line to the capacitor. This is where the self-refresh current reduction is achieved.

18 Claims, 7 Drawing Sheets

| STATE | PRECHARGE | INITIAL BL SENSING | COMPLETE BL SENSING | CHARGE RECYCLING | PRECHARGE |
|---|---|---|---|---|---|
| | T0 | T1 | T2 | T3 | T4 |
| PSC VOLTAGE | $V_{BLH}$ | $\dfrac{2m+1}{2m+2} V_{BLH}$ | $\dfrac{2m+1}{2m+2} V_{BLH}$ | $\dfrac{2m^2+3m+2}{2(m+1)^2} V_{BLH}$ | $V_{BLH}$ |
| NSC VOLTAGE | 0 | $\dfrac{1}{2m+2} V_{BLH}$ | $\dfrac{1}{2m+2} V_{BLH}$ | $\dfrac{m}{2(m+1)^2} V_{BLH}$ | 0 |
| AVERAGE BL VOLTAGE | $\dfrac{V_{BLH}}{2}$ | $\dfrac{2m+1}{2m+2} V_{BLH}$ | $V_{BLH}$ | $\dfrac{2m^2+3m+2}{2(m+1)^2} V_{BLH}$ | $\dfrac{V_{BLH}}{2}$ |
| AVERAGE /BL VOLTAGE | $\dfrac{V_{BLH}}{2}$ | $\dfrac{1}{2m+2} V_{BLH}$ | 0 | $\dfrac{m}{2(m+1)^2} V_{BLH}$ | $\dfrac{V_{BLH}}{2}$ |

CHARGE TO BL FROM VBLH  $\dfrac{V_{BLH} \cdot C_{BL}}{2(m+1)}$

CHARGE TO PSC FROM VBLH  $\dfrac{m^2 \cdot V_{BLH} \cdot C_{BL}}{2(m+1)^2}$

SENSING CURRENT RECYCLING METHOD DURING SELF-REFRESH

FIELD OF THE INVENTION

This invention relates to dynamic random access memory (DRAM) devices, and more particularly to techniques to reduce the sensing current during DRAM self-refresh mode.

BACKGROUND OF THE INVENTION

DRAM devices are memory devices that require repeated refreshing of the storage cells in a bank of memory cells. Bit line sensing current is a major part of the self-refreshing process. The self-refresh current is an important performance factor for mobile or portable DRAM devices, because the self-refresh current is directly related to battery performance of the mobile or portable host device.

FIGS. 1 and 2 illustrate a prior art bit line sensing arrangement for a cell array. There is a plurality of bit line sensing amplifier (BLSA) blocks 0–n, assigned reference numerals 5(0) to 5(N), respectively. Each BLSA block comprises a BLSA 10(j) for each column (j=0 to M) of the storage cell array. There is a BLSA block located at both sides of a cell array, as is known in the art. Each BLSA 10(j) associated with a particular column is connected to a bit line (BL) and a BL complement (/BL). FIG. 1 has been simplified and does not show the cell arrays, and the BL and /BL are shown for only one BLSA 10(0).

Each BLSA block has a PMOS source node (PS) and an NMOS source node (NS) that are electrically connected to each BLSA throughout a BLSA block. Transistors MP0 and MN0 charge and discharge the PS and NS, respectively, after the wordlines (WLs) are activated. An equalization circuit 20 included in each BLSA block is controlled by an equalization control signal (EQ) and in response sets the voltages at PS and NS equal to VBLEQ during precharge.

With reference to FIG. 2, during precharge, the EQ signal stays high, and as a result all BLs are at VBLEQ. PSET and NSET are control signals that activate the BLSAs. To activate a BLSA block, PSET goes from high to low and NSET goes from low to high. During an activate interval, the voltage at PS goes from VBLEQ to VBLH and the voltage at NS from VBLEQ to ground (GND). The problem with the prior art bit line sensing configuration described above is that a significant amount of sensing current is used for bit line sensing. Again, since this current is used during self-refresh, there is a significant impact on the battery performance when the DRAM is used in a mobile or portable device.

It is desirable to reduce the amount of sensing current during a self-refresh mode of a DRAM device, to thereby reduce current drain on the host device in which the DRAM device resides.

SUMMARY OF THE INVENTION

Briefly, a bit line sensing scheme is provided for a semiconductor memory device that significantly reduces current drain during a self-refresh mode. After wordline activation and bit line sensing of a selected wordline, a capacitor is connected to a source node associated with a bit line sensing amplifier for the selected wordline to charge the capacitor with charge remaining on the bit line. Then, during the next activate-precharge cycle for another selected wordline, the capacitor is coupled to the source node of a bit line sensing amplifier associated with another selected wordline to discharge charge stored by the capacitor to the bit line associated with said other selected wordline. Thus, charge is returned from the bit line to the capacitor. This is where the self-refresh current reduction is achieved.

The semiconductor memory device, comprises a block of bit line sensing amplifiers, at least one bit line sensing amplifier connected to a bit line that in turn connects to a corresponding column of an array of storage cells; a source node connected to each bit line sensing amplifier in said block. A capacitor is provided that is selectively connected to the source node to be charged by the source node, and to discharge to the source node. To this end, a switch is provided that is responsive to a control signal to connect the capacitor to the source node to transfer charge remaining on the bit line after a bit line sensing operation for a selected wordline address to the capacitor. The switch is further responsive to the control signal during a time interval prior to wordline activation for another selected wordline to couple the capacitor to the source node of a bit line sensing amplifier associated with said other selected wordline to discharge charge stored by the capacitor to the bit line associated with the other selected wordline.

Objects and advantages of the techniques described herein will become more readily apparent when reference is made to the following description taken in conjunction with the accompanying drawings.

BRIEF DESCRIPTION OF THE DRAWINGS

FIG. 5 is a chart illustrating the computations that explain the bit line sensing current reduction achieved by the arrangement shown in FIG. 3.

DETAILED DESCRIPTION

Figure 1:
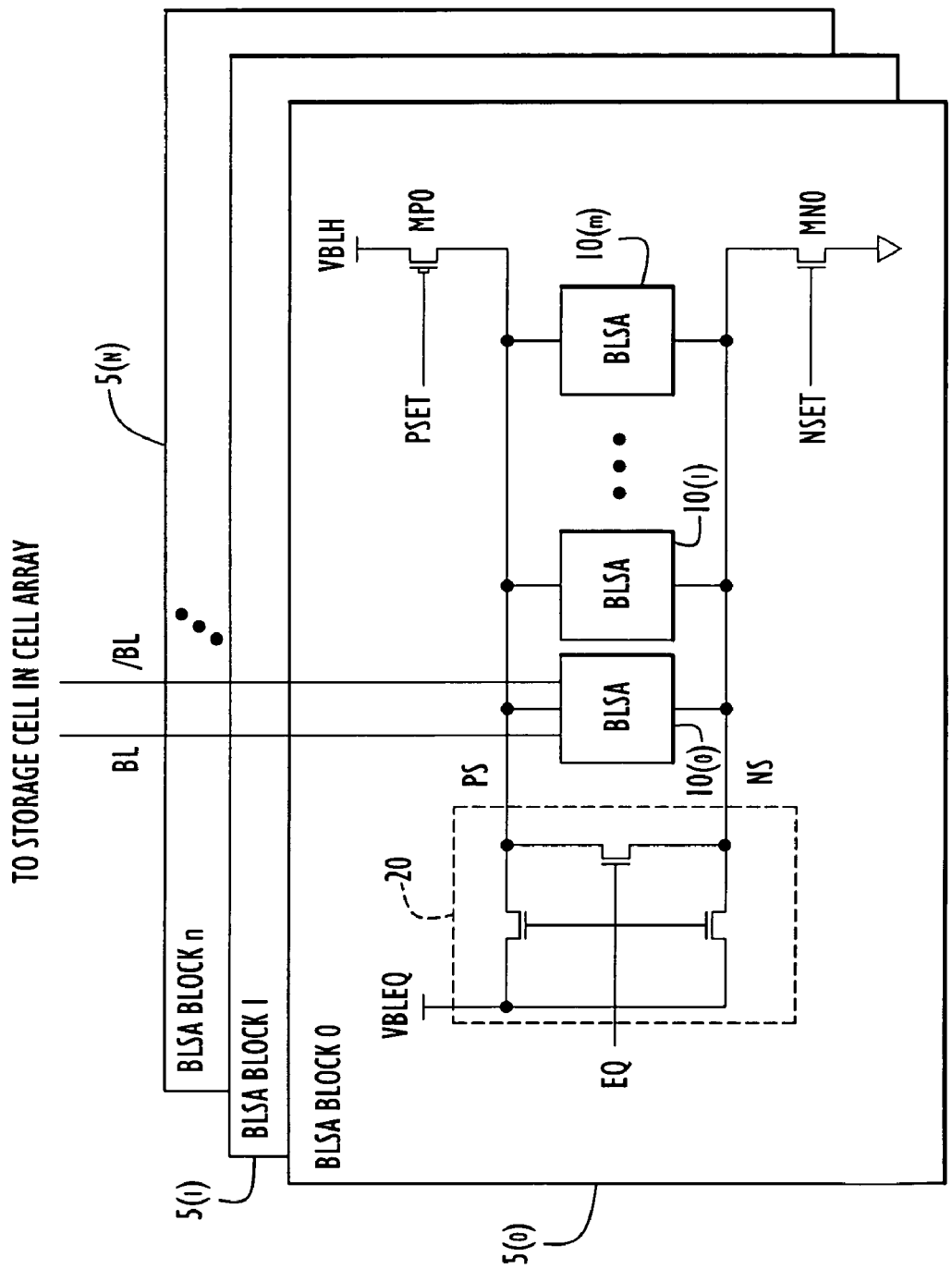
FIG. 1 is a block diagram of a portion of DRAM device and showing a prior art bit line sensing arrangement.
Figure 2:
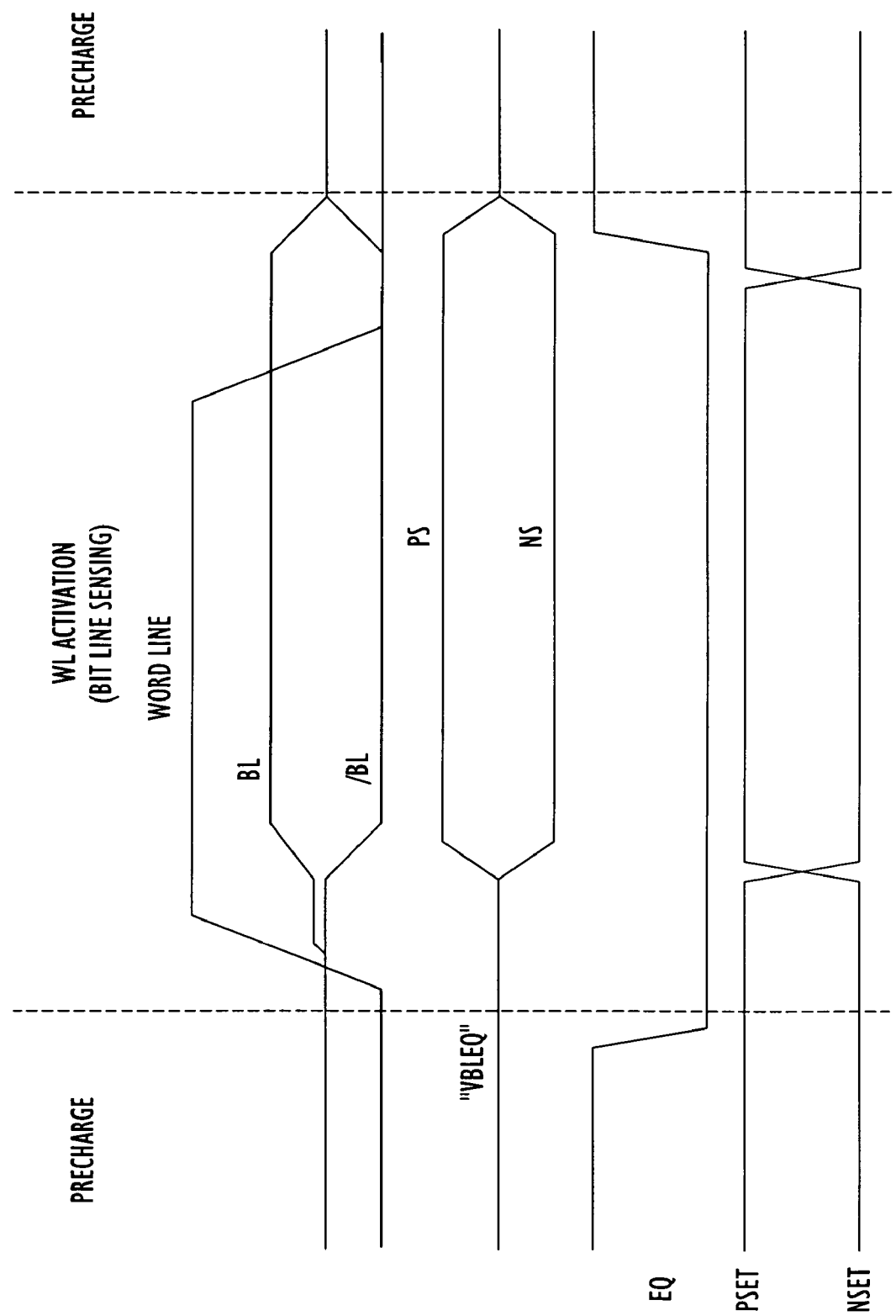
FIG. 2 is a timing diagram depicting operation of the prior art bit line sensing arrangement shown in FIG. 1.
Figure 3:
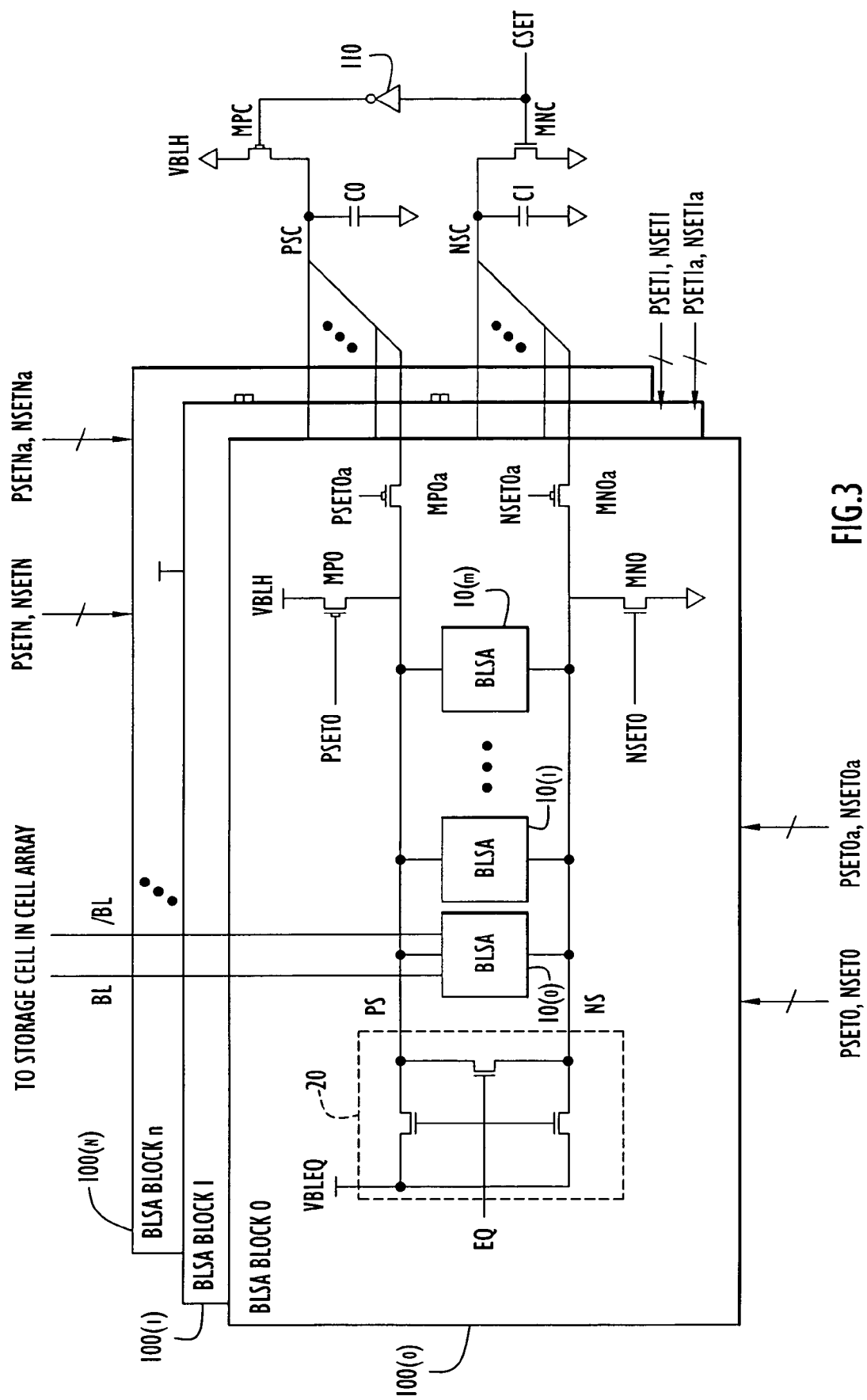
FIG. 3 is a block diagram of a portion of a DRAM device and showing a bit line sensing current recycling arrangement according to the techniques described herein.

Referring first to FIG. 3, a recycling sensing arrangement will be described. There are multiple blocks of bit line sensing amplifiers (BLSAs). In each BLSA block, each (but in any event at least one) BLSA is connected to a corresponding bit line (BL) (and bit line complement, /BL) that in turn connects to a corresponding column of an array of storage cells. The BLSA blocks are assigned reference numerals 100(0) to 100(N). There are two capacitors C0 and C1 associated with the BLSA blocks 100(0) to 100(N) for storing charge and discharging as described hereinafter. Capacitor C0 is connected to a common PMOS source node (PSC) and capacitor C1 is connected to a common NMOS source node (NSC). A first pair of switches consisting of transistor switches MPC and MNC, connects (and disconnects) the capacitors C0 and C1 to a core voltage (VBLH) and ground, respectively, in response to a control signal called CSET. Transistor switch MPC is controlled by CSET complement (/CSET) via inverter 10 and transistor switch MNC is controlled by CSET.

In each BLSA block 100(0) to 100(N) there are a PMOS source node (PS) and an NMOS source node (NS). The common source nodes PSC and NSC are connected to PS and NS, respectively, in the selected BLSA block(s). A second pair of switches consisting of transistor switches MPia and MNia are provided in each BLSA block between the PS and PSC nodes and the NS and NSC nodes, respectively, for each of the BLSA blocks i=0 to N. Taking BLSA block 100(0) as an example, the second pair of transistor switches MP0a and MN0a are responsive to a control signal pair consisting of signals PSET0a and NSET0a to connect (and disconnect) the nodes PS and NS to capacitors C0 and C1, respectively, which in essence connects nodes PS and NS in BLSA block 100(0) to the nodes PSC and NSC corresponding to the voltage across capacitors C0 and C1, respectively. Similarly, in each of the other BLSA blocks, the transistor switch pair MPia and MNia is responsive to a control signal pair consisting of PSETia and NSETia, for i=1 to N to connect (and disconnect) the nodes PS and NS to PSC and NSC, respectively, in each of the other BLSA blocks.

A third pair of transistor switches consists of transistors MP0 and MN0. These transistor switches are controlled by a control signal pair consisting of signals now designated PSET0 and NSET0, respectively. Transistor switches MP0 and MN0 connect and disconnect the nodes PS and NS, respectively, to and from the core voltage VBLH and GND, respectively. There is a third pair of transistor switches MP0 and MN0 in each BLSA block that performs a similar function, in response to signal pair PSETi, NSETi, for i=0 to N.

As shown in FIG. 3, the transistor switch MPC has a source connected to the core voltage, VBLH, and a drain connected to one terminal of the capacitor C0, corresponding to node PSC. The control signal/CSET is coupled to the gate (inverted) of transistor MPC. Similarly, the transistor switch MNC has a source connected to ground and a drain connected to the node NSC. The control signal CSET is coupled to the gate of transistor MNC. Transistor switch MP0 a has a source connected to the node PSC and a drain connected to the node PS. The control signal PSET0 a is connected to the gate (inverted) of transistor MP0a. Likewise, the transistor switch MN0a has a drain connected to the node NSC and a source connected to the node NS. The control signal NSET0a is connected to the gate of the transistor switch MN0a. Finally, the transistor switch MP0 comprises a source connected to the core voltage VBLH and a drain connected to the node PS. The signal PSET0 is connected to the gate (inverted) of transistor MP0. Similarly, transistor MN0 has a drain connected to ground and a source connected to node NS. The control signal NSET0 is connected to the gate of transistor MN0.

The first, second and third pairs of transistor switches shown in FIG. 3 are only examples of switching mechanisms suitable for connecting and disconnecting various nodes of the circuitry shown in FIG. 3. Other types of switches may be used.

Figure 4:
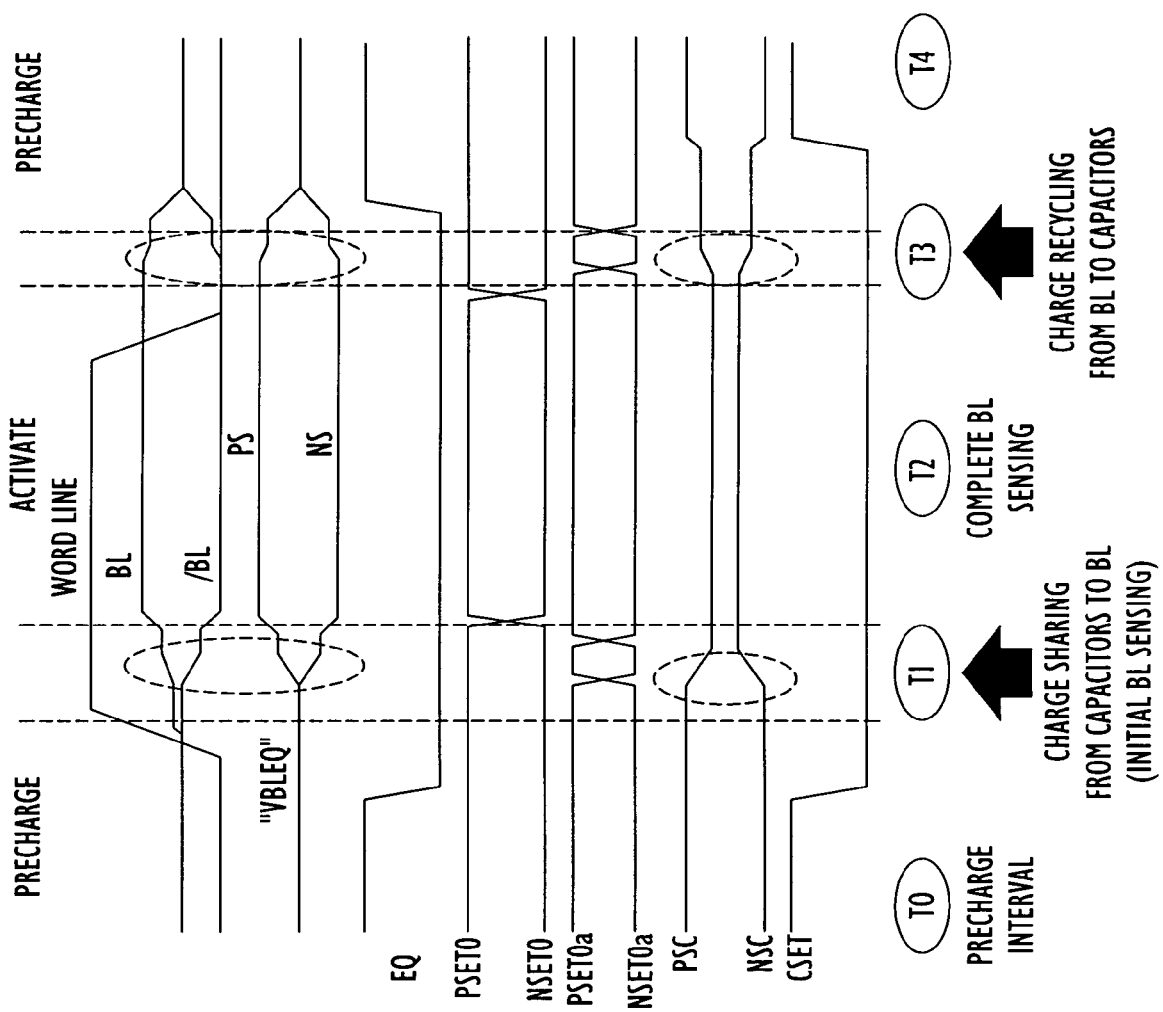
FIG. 4 is a timing diagram showing operation of the bit line sensing current recycling arrangement shown in FIG. 3.

Turning to FIG. 4 with continued reference to FIG. 3, operation of the recycling bit line sensing arrangement will be described with respect to a single BLSA block, block 100(0). This process may be executed during a self-refresh mode (IDD6) of a DRAM device. During a first time interval T0 corresponding to the precharge time interval, CSET is high, causing transistor switches MPC and MNC to turn on (close). Consequently, the voltage at PSC is the core voltage VBLH and the voltage at NSC is ground (GND).

At some point towards the end of time interval T0, CSET goes low and wordline (WL) activation begins, shown as WL going high. To activate BLSAs 10(0) to 10(M) in selected one or more BLSA blocks 100(0)–100(N), CSET goes low, causing the first pair of transistor switches MPC and MNC to turn off (open circuit). Then, a short time interval later and at the beginning of the second time interval T1, PSET0a goes low and NSET0a goes high, causing transistor switches MP0a and MN0a to turn on (close). (If BLSA block 100(1) is selected, then control signal pair PSET1a, NSET1a is applied, and so on.) This action connects the node PS to the node PSC, which couples node PS to the voltage across capacitor C0, and similarly connects the node NS to the node NSC, which couples the node NS to the voltage across capacitor C1. With transistor switches MPC and MNC open (as a result of CSET being low) and transistor switches MP0a and MN0a closed, the voltage (charge) across capacitor C0 is shared with, or transferred to, node PS and the voltage (charge) across capacitor C1 is shared with, or transferred to, node NS. Thus, time interval T1 is referred to as an initial sensing time interval, because by this action, charge from capacitors C0 and C1 is transferred to the BL associated with one or more of the BLSAs in the activated BLSA block. At the end of time interval T1, the control signal pair PSET0a and NSET0a reverts back to their state during precharge in which PSET0a is high and NSET0a is low. Next, during time interval T2, transistor switches MP0 and MN0 turn on (close) in response to PSET0 going low and NSET0 going high, to couple the nodes PS and NS to VBLH and GND, respectively, thereby charging the BL for BL sensing and finish BL sensing completely. Thus, bit line sensing occurs during time interval T1, the initial bit line sensing interval when charge stored in the capacitors C0 and C1 from a previous activate-precharge cycle is discharged to PS and NS to the BL, and during time interval T2 during which bit line sensing is completed when the nodes PS and NS are connected to the core voltage and GND, respectively.

Wordline activation is terminated (WL deactivation) towards the end of time interval T2. After WL activation is terminated (WL goes low), control signal PSET0 goes high and NSET0 goes low causing transistors MP0 and MN0 to turn off (open) at the end of time interval T2.

Shortly thereafter, during time interval T3, PSET0 a goes low and NSET0 a goes high, causing transistors MP0a and MN0a to turn on (close). This causes node PS to connect to node PSC and node NS to connect to node NSC so that some of the charges on the BL associated with at least one BLSA in the BLSA block to be transferred to the capacitors C0 and C1. Thus, some BL charges, or in other words, current, is returned to the capacitors C0 and C1, i.e., recycled and can be used again at the next activate-precharge cycle, thereby reducing the bit line sensing current. At the end of the time interval T3, PSET0a goes high and NSET0a goes low, causing transistor switches MP0a and MN0a to turn off (open), thereby disconnecting nodes PSC and NSC from nodes PS and NS, respectively. Time interval T4 thus ensues which corresponds to time interval T0, the precharge time interval before the next WL activation. This process repeats for each WL activation cycle and in a similar manner for each BLSA block.

The circled areas in FIG. 4 illustrate where the capacitors C0 and C1 discharge to the source nodes PS and NS (and hence BL and /BLS) during time interval T1 and where the capacitors C0 and C1 are charged (charge is recycled) by the charge remaining on the bit line during time interval T3.

To summarize, the bit line sensing method comprises: during a first time interval connecting a first capacitor to a core voltage and a second capacitor to ground; for a second time interval beginning after the first time interval, connecting the first and second capacitors to first and second source nodes, respectively, of a block of a plurality of bit line sensing amplifiers to transfer charge from the first and second capacitors to a bit line associated with the block of bit line sensing amplifiers; for a third time interval beginning after completion of the second time interval, connecting the first and second source nodes to the core voltage and ground, respectively, to complete bit line sensing; and after completion of said third time interval, connecting the first and second capacitors to the first and second source nodes, respectively, to transfer charge on the bit line associated with the block of bit line sensing amplifiers to the first and second capacitors.

Said more broadly, the bit line sensing method comprises: during a first time interval connecting a capacitor to a voltage; for a second time interval beginning after the first time interval, connecting the capacitor to a source node of a block of a plurality of bit line sensing amplifiers to transfer charge from the capacitor to a bit line associated with the block of bit line sensing amplifiers; for a third time interval beginning after completion of the second time interval, connecting the source node to the voltage to complete bit line sensing; and after completion of said third time interval, connecting capacitor to the source node to transfer charge on the bit line associated with the block of bit line sensing amplifiers to the capacitor.

Moreover, a semiconductor memory device comprising: a block of bit line sensing amplifiers, at least one bit line sensing amplifier connected to a bit line that in turn connects to a corresponding column of an array of storage cells; first and second source nodes connected to each bit line sensing amplifier in said block of bit line sensing amplifiers; first and second capacitors; a first pair of switches that is responsive to a first control signal to connect the first and second capacitors to a core voltage and ground, respectively, during a first time interval (T0); a second pair of switches that is responsive to a second control signal pair to connect the first and second capacitors to the first and second source nodes respectively, to transfer charge from the first and second capacitors to a bit line associated with at least one bit line sensing amplifier in the block of bit line sensing amplifiers for a second time interval (T1) beginning after the first time interval (T0), and at an end of the second time interval (T1) the second pair of switches is further responsive to the second control signal pair to disconnect the first and second capacitors from the first and second source nodes, respectively; and a third pair of switches that is responsive to a third control signal pair to connect the first and second source nodes to the core voltage and ground, respectively, for a third time interval (T2) beginning after the second time interval (T1) to complete bit line sensing. The second pair of switches is further responsive to the second control signal pair to connect the first and second capacitors to the first and second source nodes, respectively, during a fourth time interval (T3) beginning after the third time interval (T2), to transfer charge from the bit line to the first and second capacitors, respectively. Further, the second pair of switches is further responsive to the second control signal pair to disconnect the first and second capacitors from the first and second source nodes, respectively, at the end of the fourth time interval (T3). As shown in FIG. 4, the first pair of switches is responsive to the first control signal that occurs after wordline activation begins. The second pair of switches is responsive to the second control signal pair after wordline activation terminates to connect the first and second capacitors to the first and second source nodes, respectively during the fourth time interval (T3).

Again, stated more broadly, a semiconductor memory device is provided comprising: a block of bit line sensing amplifiers, at least one bit line sensing amplifier connected to a bit line that in turn connects to a corresponding column of an array of storage cells; a source node connected to each bit line sensing amplifier; a capacitor; a first switch that is responsive to a first control signal to connect the capacitor to a core voltage during a first time interval; a second switch that is responsive to a second control signal to connect the capacitor to the source node to transfer charge from the capacitor to a bit line associated with at least one bit line sensing amplifier in the block of bit line sensing amplifiers for a second time interval beginning after the first time interval, and after the second time interval the second switch is further responsive to the second control signal to disconnect the capacitor from the source node; and a third switch that is responsive to a third control signal to connect the source node to the core voltage for a third time interval beginning after the second time interval to complete bit line sensing. The second switch is further responsive to the second control signal to connect the capacitor to the source node during a fourth time interval beginning after the third time interval to transfer charge from the bit line to the capacitor.

FIG. 5 illustrates the amount of BL sensing current reduction possible using the techniques described above. For simplicity, some assumptions are made. Data high (H) and low (L) are distributed evenly throughout BL and /BL. Therefore, average voltages on BL and /BL are 0.5 * VBLH in each BLSA block after a WL is activated. The BL capacitance for a BLSA block, CBL, is the sum of all BL capacitances Cb1 in a BLSA block. C0=C1=m * CBL. VBLH is equal to the core voltage and VBLEQ is equal to 0.5 * VBLH. The total charge required to sense data in a BLSA block=0.5 * VBLH * CBL for conventional bit line sensing. Thus, in the case where m=1 (C0=C1=CBL), the total bit line sensing current from VBLH is reduced by 25%.

Figure 6:
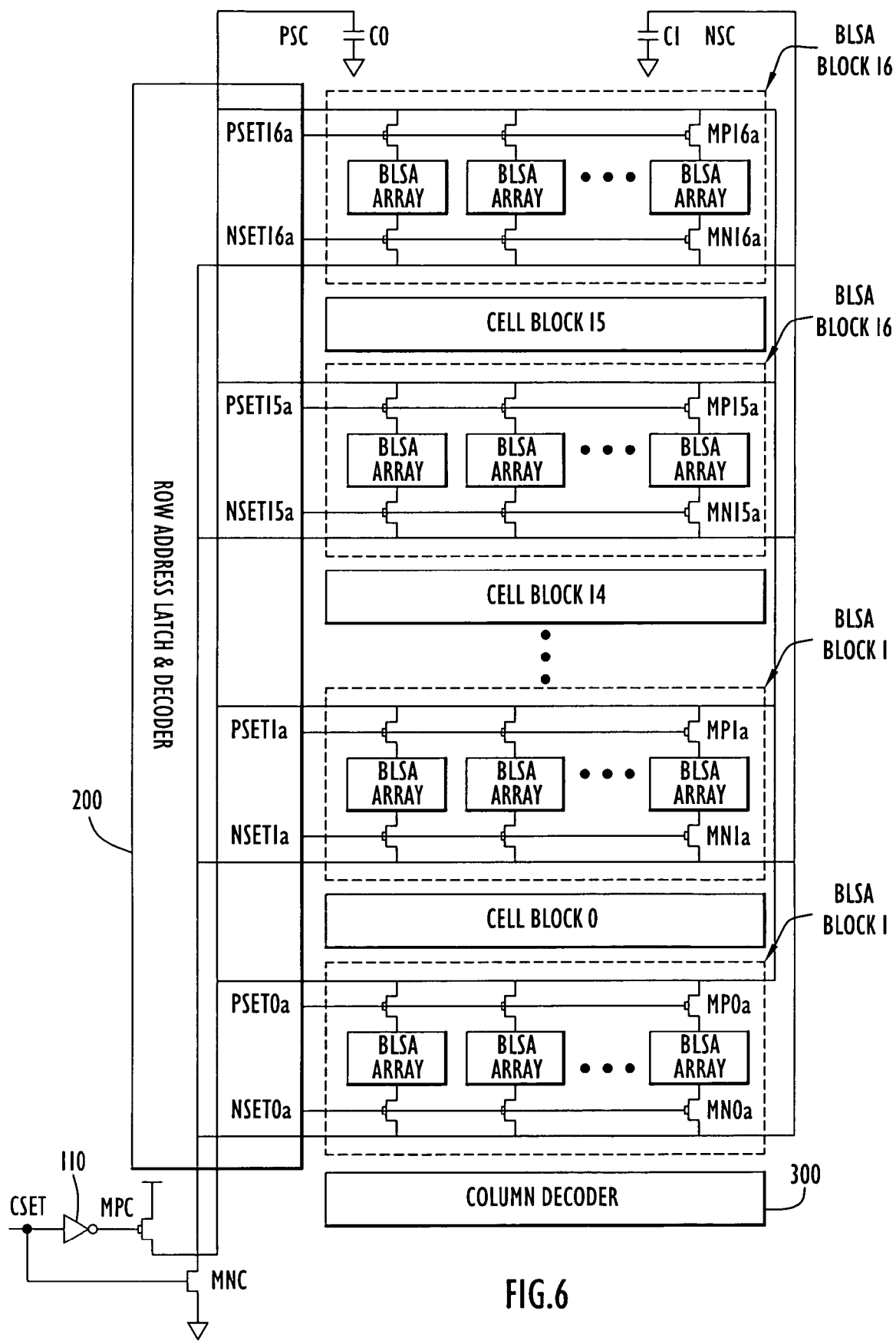
FIG. 6 is a block diagram of a DRAM bank that employs the bit line sensing current recycling techniques described herein.

Turning to FIG. 6, an example of how the sensing current recycling technique may be implemented in a DRAM bank will be described. In this example, there are 17 memory cell array blocks, numbered 0 to 16. Thus, there are 17 BLSA blocks, numbered 0 through 16 corresponding to the memory cell blocks. In each BLSA block, there are BLSA arrays that consist of a plurality or of BLSAs connected in parallel between the transistor switches MPia and MNia, where i is the BLSA block index (i=0 to 16) in this example. Thus, for convenience, there is a transistor switch pair MPia and MNia for each BLSA array in a BLSA block. There is a row address latch and decoder circuit 200 and a column decoder 300. The row address latch and decoder circuit 200 supplies signals on lines PSET0a, NSET0a, PSET1a, NSET1a, . . . , PSET16a, NSET16a that are coupled to the corresponding transistors MPia and MNia of the corresponding BLSA blocks. PSC and NSC lines are connected throughout the bank. The transistor switches MPia and MNia in the BLSA blocks are therefore gated by the corresponding signal pairs PSETia, NSETia (for i=0 to 16). The transistor switches MPia and MNia may be implemented inside a BLSA. Alternatively, they may be implemented inside the row address latch and decoder circuit 200.

Capacitors C0 and C1 may be implemented with a gate capacitor or a trench capacitor that can be distributed in PSC and NSC sub-networks. Switches MPi and MNi controlled by PSETi and NSETi (i=0 to 16), respectively, and the equalization circuit 20 in each BLSA block are not shown in order to keep the diagram simple. The CSET signal is generated from (such as by an AND operation of) bank select and self refresh flag signals so that this process is performed only during self-refresh of a particular storage cell bank. The capacitance ratio, m=C0/CBL or C1/CBL, is related to the voltage swing during the initial sensing interval. For example, m may be equal 2 to 3, considering the minimal BLSA transistor threshold voltage.

Figure 7:
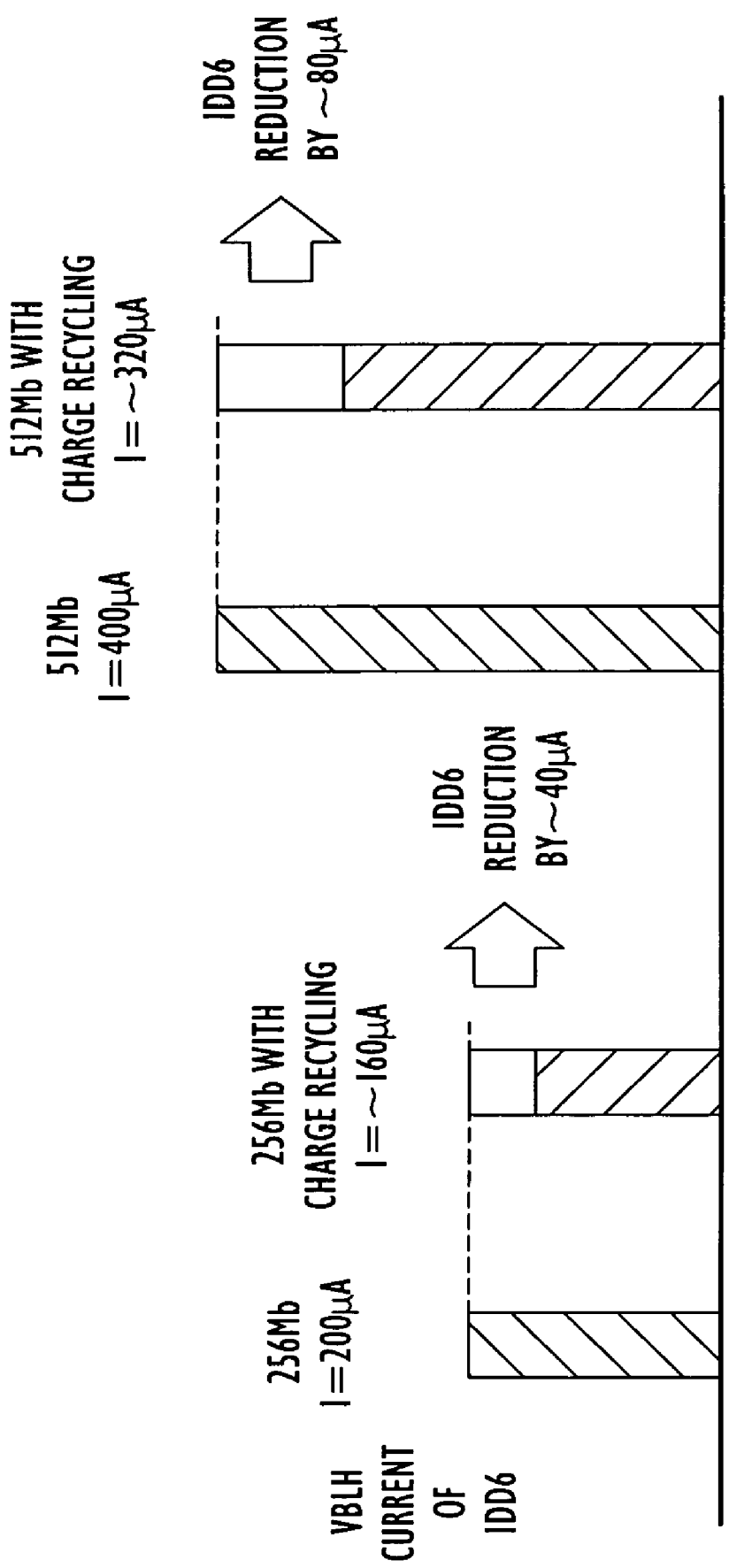
FIG. 7 is a chart that illustrates the current reduction achieved by the recycling techniques described herein.

The bit line charge recycling sensing method described above reduces the self-refresh current (IDD6), which is particularly desirable for lower power DRAM devices, such as DRAMs for mobile or portable devices/applications. FIG. 7 shows that for a 256 Mbyte DRAM device having a bit line sensing current of 200 μA during the self refresh, the bit line sensing current can be reduced to approximately 160 μA with the recycling techniques described herein. Similarly, for a 512 Mbyte DRAM device, the bit line sensing current can be reduced from 400 μA to 320 μA.

Several factors may be considered when designing a DRAM device with charge recycling. The capacitance ratio m between C0 (or C1) and CBL is a trade-ff for initial sensing voltage swing and capacitor area. The PSC and NSC sub-networks need to be connected well as is the case with other power networks to reduce the charge sharing time. The charge sharing time is fast enough to maintain a reasonable row active time ($t_{RAS}$). Moreover, the bit line sensing method executes only during self-refresh. Therefore, there is no negative impact on the row to column delay time ($t_{RCD}$) and row precharge time ($t_{RP}$).

The bit line sensing method described herein can be summarized as follows. After wordline activation and bit line sensing of a selected wordline, a capacitor is connected to a source node associated with a bit line sensing amplifier for the selected wordline to charge the capacitor with charge remaining on the bit line. At the next precharge-activate cycle for another selected wordline, the capacitor is connected to the source node of a bit line sensing amplifier associated with another selected wordline to discharge charge stored by the capacitor to the bit line associated with said other selected wordline.

Similarly, a semiconductor memory device is provided comprising: a block of bit line sensing amplifiers, at least one bit line sensing amplifier connected to a bit line that in turn connects to a corresponding column of an array of storage cells; a source node connected to each bit line sensing amplifier in said block; a capacitor; and a switch that is responsive to a control signal to connect the capacitor to the source node to transfer charge remaining on the bit line after a bit line sensing operation for a selected wordline address to the capacitor, and further responsive to the control signal during a time interval prior to wordline activation for another selected wordline to couple the capacitor to the source node of a bit line sensing amplifier associated with said other selected wordline to discharge charge stored by the capacitor to the bit line associated with the other selected wordline.

The device and methods described herein may be embodied in other specific forms without departing from the spirit or essential characteristics thereof. The foregoing embodiments are therefore to be considered in all respects illustrative and not meant to be limiting.

What is claimed is:

1. A method for bit line sensing in a semiconductor memory device, comprising:
   a. during a first time interval connecting a first capacitor to a core voltage and a second capacitor to ground;
   b. for a second time interval beginning after the first time interval, connecting the first and second capacitors to first and second source nodes, respectively, of a block of a plurality of bit line sensing amplifiers to transfer charge from the first and second capacitors to a bit line associated with the block of bit line sensing amplifiers;
   c. for a third time interval beginning after completion of the second time interval, connecting the first and second source nodes to the core voltage and ground, respectively, to complete bit line sensing; and
   d. after completion of said third time interval, connecting the first and second capacitors to the first and second source nodes, respectively, to transfer charge on the bit line associated with the block of bit line sensing amplifiers to the first and second capacitors.

2. The method of claim 1, wherein (a) connecting comprises connecting the first capacitor to a bit line high voltage.

3. The method of claim 1, wherein the first time interval precedes wordline activation, (b) connecting occurs after wordline activation begins and (d) connecting begins after wordline activation terminates.

4. The method of claim 1, wherein (a)–(d) are performed during a self-refresh mode of a memory device.

5. The method of claim 1, and further comprising repeating (a)–(d) for each of a plurality of blocks of bit line sensing amplifiers.

6. A method for bit line sensing in a semiconductor memory device, comprising:
   a. during a first time interval connecting a capacitor to a voltage;
   b. for a second time interval beginning after the first time interval, connecting the capacitor to a source node of a block of a plurality of bit line sensing amplifiers to transfer charge from the capacitor to a bit line associated with the block of bit line sensing amplifiers;
   c. for a third time interval beginning after completion of the second time interval, connecting the source node to the voltage to complete bit line sensing; and
   d. after completion of said third time interval, connecting the capacitor to the source node to transfer charge on the bit line associated with the block of bit line sensing amplifiers to the capacitor.

7. The method of claim 6, wherein (a) connecting comprises connecting the capacitor to a bit line high voltage.

8. The method of claim 6, wherein the first time interval precedes wordline activation, (b) connecting occurs after wordline activation begins and (d) connecting begins after wordline activation terminates.

9. The method of claim 6, wherein (a)–(d) are performed during a self-refresh mode of a memory device.

10. A method for bit line sensing in a semiconductor memory device, comprising:
   a. during a precharge time interval preceding wordline activation, connecting a first capacitor to a core voltage and a second capacitor to ground;
   b. during a first bit line sensing time interval beginning after the precharge time interval, connecting the first and second capacitors to first and second source nodes, respectively, of a block of a plurality of bit line sensing amplifiers to transfer charge from the first and second capacitors to a bit line associated with the block of bit line sensing amplifiers;

c. during a second bit line sensing time interval beginning after completion of the first bit line sensing time interval, connecting the first and second source nodes to the core voltage and ground, respectively, to complete bit line sensing; and d. after completion of said second bit line sensing time interval, connecting the first and second capacitors to the first and second source nodes, respectively, to transfer charge on the bit line associated with the block of bit line sensing amplifiers to the first and second capacitors.

11. The method of claim 10, wherein (a) connecting comprises connecting the first capacitor to a bit line high voltage.

12. The method of claim 10, wherein the first time interval precedes wordline activation, (b) connecting occurs after wordline activation begins and (d) connecting begins after wordline activation terminates.

13. The method of claim 10, wherein the first bit line sensing interval begins after wordline activation has commenced.

14. The method of claim 10, wherein the acts of connecting in (a)–(d) are performed by turning on transistor switches.

15. A method for bit line sensing in a semiconductor memory device, comprising:
a. after bit line sensing of a selected wordline and deactivation of the selected wordline, coupling a capacitor to a source node associated with a bit line sensing amplifier for the selected wordline to charge the capacitor with charge remaining on the bit line; and b. coupling the capacitor to the source node of a bit line sensing amplifier associated with another selected wordline to discharge charge stored by the capacitor to the bit line associated with said other selected wordline.

16. The method of claim 15, wherein (b) coupling is performed during a time interval after a precharge time interval.

17. The method of claim 15, wherein during a time interval subsequent said (b) coupling, further comprising coupling a core voltage to the source node associated with the bit line sensing amplifier associated with said other selected wordline to complete bit line sensing.

18. The method of claim 15, and further comprising during a precharge time interval, coupling the capacitor to a core voltage to charge the capacitor prior to said (b) coupling.

* * * * *